United States Patent [19]
Dery et al.

[11] Patent Number: 5,617,819
[45] Date of Patent: Apr. 8, 1997

[54] REMOTE STARTING SYSTEM FOR A VEHICLE HAVING A DIESEL ENGINE

[75] Inventors: Norman Dery; Guy Santerre, both of Sherbrooke, Canada

[73] Assignee: Astroflex, Inc., St.-Elie D'Orford, Canada

[21] Appl. No.: 608,932

[22] Filed: Feb. 29, 1996

Related U.S. Application Data

[63] Continuation of Ser. No. 176,036, Dec. 30, 1993, abandoned.

[51] Int. Cl.⁶ .............................. F02N 11/08; G01P 3/487
[52] U.S. Cl. ............................. 123/179.2; 123/179.3; 73/119 R; 324/207.2; 324/173
[58] Field of Search ................... 123/179.2, 179.3, 123/179.4; 290/37 A; 310/68 E, 68 B; 324/207.2, 179, 173, 167; 73/119 R

[56] References Cited

U.S. PATENT DOCUMENTS

| | | | |
|---|---|---|---|
| 3,314,007 | 4/1967 | Johnson | 324/173 |
| 3,319,164 | 5/1967 | Johnson et al. | 324/169 |
| 3,329,893 | 7/1967 | Lawless et al. | 324/173 |
| 3,404,339 | 10/1968 | Mitchell | 324/173 |
| 3,657,720 | 4/1972 | Avdenko et al. | 290/37 A |
| 3,862,429 | 1/1975 | Bucher | 123/179.2 |
| 4,023,403 | 5/1977 | Smith | 73/119 A |
| 4,319,481 | 3/1982 | Yelke | 73/119 A |
| 4,328,706 | 5/1982 | Akita et al. | 73/493 |
| 4,339,713 | 7/1982 | Kago et al. | 324/173 |
| 4,348,893 | 9/1982 | Hendrix et al. | 73/116 |
| 4,371,835 | 2/1983 | Kago et al. | 324/174 |
| 4,373,486 | 2/1983 | Nichols et al. | 123/414 |
| 4,459,548 | 7/1984 | Lentz et al. | 324/772 |
| 4,490,620 | 12/1984 | Hansen | 123/179.3 |
| 4,659,977 | 4/1987 | Kissel et al. | 320/64 |
| 4,732,034 | 3/1988 | Bjorn | 73/2 |
| 4,847,527 | 7/1989 | Dohogne | 310/218 |
| 4,953,110 | 8/1990 | Chartrand | 364/550 |

FOREIGN PATENT DOCUMENTS

| | | |
|---|---|---|
| 1214908 | 4/1966 | Germany . |
| 2238875 | 2/1974 | Germany . |
| 3017202 | 9/1986 | Germany . |
| 1435213 | 5/1976 | United Kingdom . |
| 2094981 | 9/1982 | United Kingdom . |

*Primary Examiner*—Andrew M. Dolinar
*Attorney, Agent, or Firm*—Schweitzer Cornman & Gross

[57] ABSTRACT

A system for remotely starting a diesel engine of a vehicle. The system comprises a portable hand-held RF transmitter issuing a command in the form of a binary-coded sequence. A slave controller mounted on-board the vehicle executes the command by energizing the starter motor in order to crank and start-up the diesel engine. The system includes a Hall-effect sensor responsive to the pulsating magnetic field of the diesel engine alternator for generating a signal indicative of the rotational speed of the engine. The slave controller uses this information for detecting when the engine has been successfully started in order to de-energize the starter motor.

16 Claims, 7 Drawing Sheets

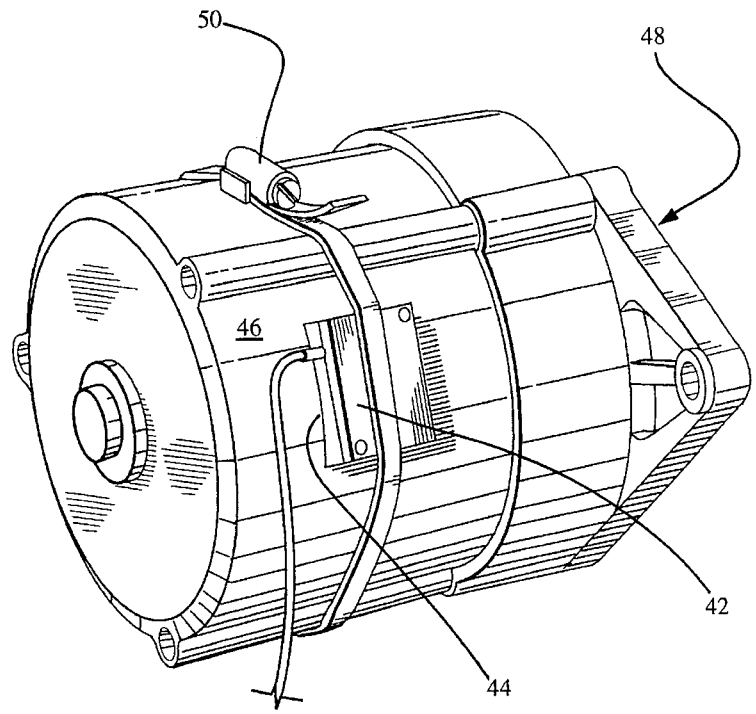
Fig.1
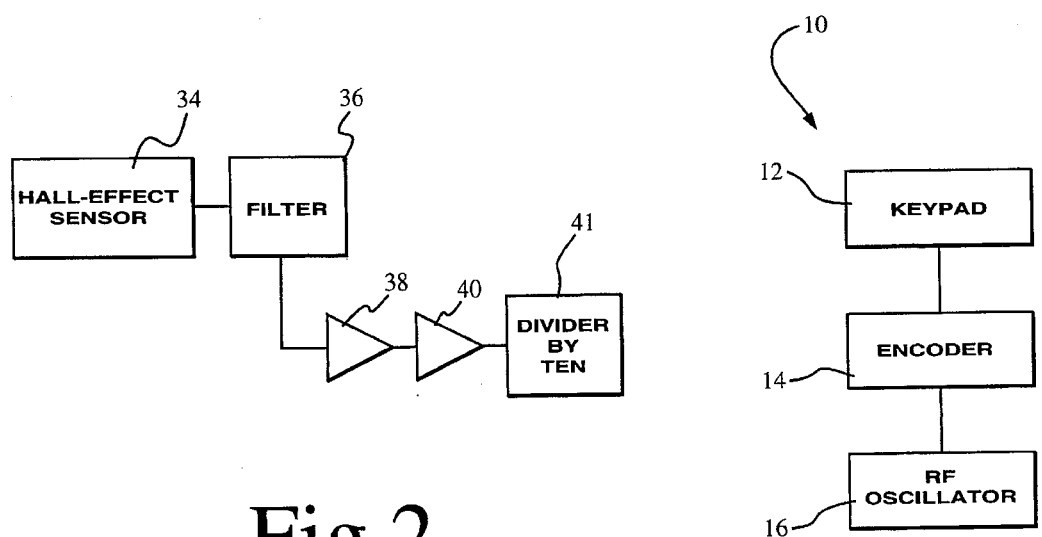
Fig.2
Fig.3

REMOTE STARTING SYSTEM FOR A VEHICLE HAVING A DIESEL ENGINE

This is a continuing application of U.S. Ser. No. 08/176, 036, filed Dec. 30, 1993; now abandoned.

FIELD OF INVENTION

The invention relates to a system for remotely starting a motor vehicle having an internal combustion engine. The system features a sensor responsive to the magnetic field pulsations produced by the alternator of the engine in order to generate a signal used for detecting the speed of rotation of the engine.

BACKGROUND OF THE INVENTION

Remote vehicle starting systems currently available on the market utilize a portable hand-held transmitter that issue a binary coded sequence in the form of an RF transmission to signal a slave controller mounted oh board the vehicle to energize the starter motor in order to crank the engine. During the start-up sequence the controller constantly monitors the rotational speed of the engine. When the speed reaches or exceeds a certain threshold, in the range of 500 to 1000 revolutions per minute (RPM), the slave controller determines that the start-up sequence has been successful and de-energizes the starter motor.

A convenient way of- determining the speed of revolution of an internal spark-induced combustion engine is to monitor the electrical activity at the ignition coil. The voltage observed at the negative terminal of the coil varies dynamically and can be represented by a pulse train where each pulsation corresponds to a single cylinder ignition event. The crank shaft speed of revolution is function of the number of pulses per unit of time (alternatively, the crank shaft speed can be expressed as function of the elapsed time between two successive pulses) and the number of cylinders of the particular engine. The latter parameter determines the quantity of pulses generated during a single crank shaft revolution.

The on-board slave controller is a microprocessor operated unit adaptable to engines having different number of cylinders. This versatility is achieved by modifying the program processing the tachometer signal from the ignition coil. During the installation oft he system, the technician accesses the programming mode of the slave controller and loads in memory the basic parameters of the engine that is to be controlled, such as the number of cylinders and the speed that the engine must attain before the starter motor is de-energized, among others. This data provides the main program with the necessary parameters to factor the engine characteristics of the specific application in the various computations of the tachometer signal.

Remote starting system for diesel engines present a difficult challenge. The absence of electric ignition that provides a convenient tachometer signal requires a special sensor to monitor the speed of rotation of the engine. The prior art has developed a number of methods to measure the speed of rotation of a diesel engine. Examples of such methods include observing the pressure pulsations of diesel fuel in the injector lines, measuring the dynamic pressure variations in the crank case and sensing by magnetic proximity sensors the motion of rocker arms. Those methods, however, are unpractical for use in remote vehicle starting systems for the following reason for the following reason. Remote vehicle starting systems are rarely installed as original equipment by automobile manufacturers. The trend is to commercialize the systems as after market equipment. Hence, the systems are designed and built for universal application in order to fit many different automobiles. This requirement rules out the use of speed sensor arrangements that are application-specific. Otherwise, the large number of different diesel engines in commercial use would require from the manufacturer of the remote starting system to design and keep in stock a wide variety of speed sensors to suit all possible applications.

OBJECTS AND STATEMENT OF THE INVENTION

An object of the invention is a device for detecting the speed of rotation of a diesel engine, that can be fitted to a wide variety of diesel engines and can be easily installed without the necessity of splicing electric conductors nor performing major disassembly operations.

Another object of the invention is to provide a remote vehicle starting system utilizing the aforementioned Yet, a further object of the invention is a remote vehicle starting system for spark-induced combustion engines that can be easily adapted to diesel applications.

As embodied and broadly described herein, the invention provides a device for detecting a rotational speed of an internal combustion engine driving an alternator, said device comprising a Hall-effect sensor for mounting to the alternator outside a casing thereof, aid all-effect sensor being responsive to a pulsating magnetic field produced by a rotor of the alternator for generating a signal indicative of the rotational speed of the internal combustion engine.

In a most preferred embodiment, the pulse train produced by the Hall-effect sensor is conditioned by a band pass filter in order to attenuate undesirable harmonic components. The filtrated signal is applied to a pair of cascaded operational amplifiers that increase its magnitude and it is finally processed in a divider circuit to reduce the frequency of the signal by a factor of 4. The assembly of electrical components is placed in a water-proof protective housing made of moulded rubber material. The housing has a concave wall to fit the generally cylindrical shape of the alternator casing.

When the engine is in operation, the rotor of the alternator produces a rotating magnetic field sweeping the Hall-effect sensor. For a stationary observer, he rotating field is perceived as successive magnetic field pulsations. In response to the pulsations, the Hall effect sensor generates an electric signal that is conditioned by the filter, amplifiers and divider circuit. The resulting pulse train has a frequency that is proportional to the speed of rotation of he alternator since the alternator is mechanically driven from the crank shaft of the engine by a fixed ratio belt/pulleys arrangement, the frequency of the pulse train is also proportional to the speed of rotation of the engine.

The speed measuring device in accordance with the invention is particularly well suited for use in a diesel engine that lacks an electric ignition system. However, there is nothing that precludes to employ the speed measuring device in a spark-induced combustion engine if for some reason it is undesirable or unpractical to use the electric ignition system as the source of the tachometer signal (for the purpose of this specification "tachometer signal" means a signal that conveys rotation speed data irrespective of the source of the signal).

As embodied end broadly described herein, the invention also provides a device for use with a diesel engine driving an alternator, said device simulating a tachometer signal reflecting an electrical activity of an ignition system of a spark-induced combustion engine, said device including:

a Hall-effect sensor for mounting to the alternator outside a casing thereof, said Hall-effect sensor being responsive to a pulsating magnetic field produced by a rotor of the alternator for generating a pulse train signal indicative of the rotational speed of the rotor; and processing means coupled to said Hall-effect sensor for reducing a rate of occurrence of pulses generated by said Hall-effect sensor, whereby individual pulses produced by said processing means simulate cylinder ignition events of the spark-induced combustion engine.

As embodied and broadly described herein, the invention also provides a system for remotely starting an engine of a vehicle, said system comprising:

a portable hand-held transmitter for generating a predetermined RF command signal;

a controller for mounting in the vehicle, said controller including:
 a) a processing unit;
 b) a receiver for sensing said predetermined RF signal, in response to detection of said predetermined RF signal said processing unit actuating a starter motor of the engine in order to drank the engine; and
 c) a device for detecting a rotational speed of the engine, said device being responsive to a pulsating magnetic field produced by an alternator of the engine for generating a signal indicative of the rotational speed of the engine, said processing unit being responsive to the signal indicative of the rotational speed of the engine to de-activate the starter motor when the engine has reached a determined speed of rotation.

The speed measuring device described earlier, based on the Hall-effect sensor technology, is particularly well-suited for use with a remote vehicle starting system to provide the slave controller mounted on board the vehicle with rotation speed data allowing the slave controller to recognize a successful engine start and then terminate the engine cranking cycle. Most preferably, the slave controller is microprocessor based. The various functions of the unit are software implemented. A program continuously checks various parameters and takes the action dictated by the program instructions. With regard to the engine start-up function, the controller actuates the starter motor in response to a coded command issued by the hand-held transmitter and continuously monitors the speed of rotation of the engine. When the speed exceeds a preset threshold, typically in the range of 500 to 1000 RPM, the program determines that the engine has successfully started and de-energizes the starter motor.

As embodied and broadly described herein, the invention also provides a system for remotely starting an internal spark-induced combustion engine of a vehicle, adapted for use on a vehicle having a diesel engine, said system comprising:

a portable hand-held transmitter for generating a predetermined RF command signal;

a slave controller for mounting in the vehicle, said slave controller including:
 a) a receiver for sensing said predetermined RF signal;
 b) a processing unit coupled to said receiver, in response to detection of said predetermined RF signal said processing unit actuating a starter motor of the engine in order to crank the engine, said processing unit including an input for receiving a tachometer signal produced by the engine in order to derive information on the speed of rotation of the engine, said processing unit is capable of selectively assuming either one of a plurality of tachometer signal processing modes, said processing modes being associated to respective internal spark-induced combustion engines having different number of cylinders;
 c) a device for detecting a rotational speed of the diesel engine, said device being responsive to a pulsating magnetic field produced by a rotor of the alternator for generating a periodic signal indicative of the rotational speed of the diesel engine, said device being connected to aid input, whereby said periodic signal is accepted by said processing unit as a tachometer signal from a virtual internal spark-induced combustion engine, said processing unit in a selected one of said processing modes acting on the tachometer signal to derive data correlated to a speed of rotation of the virtual internal spark-induced combustion engine, said processing unit Being responsive to said data to de-activate the starter motor when an observed conceptual speed of the virtual internal spark-induced combustion engine exceeds a preset limit.

A remote vehicle starting system specifically designed for use with an internal spark-induced combustion engine gathers data on the speed of rotation of the engine by observing the electrical activity at the ignition circuit. Typically, the slave controller measures the elapsed time between two successive pulses observed at the negative terminal of the ignition coil to compute the period of the pulse train that is proportional to the period of u single crank shaft revolution.

In a preferred embodiment, the slave controller multiplies the measured elapsed time by a constant correlated to the number of cylinders of the internal spark-induced combustion engine. This constant is set during the installation of the system by loading in the non-volatile memory of the slave controller a code identifying the number of cylinders of the engine. The purpose of this calculation is to normalize the tachometer signal so that any additional computation on the signal is no longer application specific. The flexible tachometer signal processing capability of the slave controller is a highly desirable feature because it allows to easily configure the system for use with a variety of spark-induced combustion engines having different number of cylinders.

In order to further enhance the versatility of the slave controller to control different type of engines, the RPM threshold at which the starter motor is de-energized can be varied. In a preferred embodiment, the technician, during the installation of the system, selects one RPM threshold value among several choices. In a highly preferred embodiment, the technician can choose between 600 or 800 RPM as the upper boundary of the RPM range during which the starter motor is energized.

The inherent adjustability of such remote vehicle starting system originally designed for internal spark-induced combustion engines, allows to adapt the system to diesel applications when used with the speed detecting device described above. The pulse train generated in response to the magnetic field pulsations of the alternator is applied to the input of the slave controller normally designed to observe the electrical activity of an engine ignition system. By configuring the slave controller for a spark-induced combustion engine having a number of cylinders that produces at a given speed of rotation a tachometer signal having a frequency approximating the frequency of the magnetic field pulsations at the alternator (after the pulsations have been conditioned by the filter, amplifier and divider circuit), it is possible to adequately start-up the diesel engine. The ability to choose different RPM threshold values to terminate the cranking sequence further expands the adjustability range.

It will be apparent that the cylinder number setting of the slave controller is not related to the number of cylinders of the diesel engine. In act, the slave controller "thinks" that it is receiving a tachometer signal from a spark-induced combustion engine while in reality the signal reflects the magnetic field variations at the alternator.

The number of cylinders and the RPM threshold settings of the slave controller for a diesel application can be optimized by trial and error during the installation procedure. Firstly, the technician will select the number of cylinder setting that is deemed appropriate. Next he selects the RPM threshold value, say 600 RPM. A test is then performed. If the lave controller terminates the cranking sequence at an actual RPM value of the diesel engine either too high or too low, but still relatively close to the ideal speed of the diesel engine at which the starter motor should be deactivated, the technician can make incremental setting changes by switching to a different RPM threshold value. This constitutes the fine adjustment. For a broader adjustment step, the lave controller can be set to a different number of cylinders setting and the fine adjustment procedure repeated until best overall setting is achieved.

The remote vehicle starting system described above is highly advantageous because it can be used on spark-induced combustion engines and it is easily adapted to diesel applications. Accordingly, the manufacturer needs to carry in stock only hand-held transmitters, slave controller and a limited number of alternator speed detecting devices that are supplied only for diesel installations.

BRIEF DESCRIPTION OF THE DRAWINGS

FIG. 1 is a perspective view of the device for detecting the speed of rotation of an internal combustion engine by observing the magnetic pulsations at the alternator;

FIG. 2 is a functional diagram of the speed detecting device shown in FIG. 1;

FIG. 3 is a functional diagram of the portable hand-held transmitter of the remote vehicle starting system in accordance with the invention;

In the preferred embodiment, the remote vehicle starting system in accordance with the invention comprises a portable hand-held transmitter and a slave controller mounted on board the vehicle. Both units are commercially available as a kit from ASTROFLEX INC., Canada under part number RS 400 or RS 404. With reference to FIG. 3, the portable hand-held transmitter, designated comprehensively by the reference numeral 10, includes a keypad 12 comprising a plurality of keys that can be depressed individually or in combination to command various functions of the vehicle, such as starting the engine, activating or de-activating the alarm system, locking or unlocking the doors, raising or lowering the windows, and unlocking the trunk, among others.

The signals generated by depressing one or more keys of the keypad 12 are received by an encoder 14 generating a composite binary coded sequence that is supplied to an RF oscillator 16 for transmission of the coded sequence. The encoder 14 may be constituted by a non-volatile memory that contains a map of the binary coded sequences indicative of the various operational states of the vehicle components that are remotely controlled, correlated with various signal generated by the keypad 12. When a certain key, or a combination of keys are depressed, the ensuing signal is supplied to the memory which retrieves from the map the corresponding binary coded sequence. In turn, the sequence is supplied to the RF oscillator 16 for transmission to the slave controller on board the vehicle.

In a different form of construction, the encoder 14 may be constituted by an array of hard-wired logic gates generating the predetermined binary coded sequence in response to the signals of the keypad 12. This mode of construction is more economical than the approach utilizing a non-volatile memory at the expense of a reduced flexibility. Pot instance, a hard-wire logical circuit must be entirely redesigned when a change in the binary coded sequence is required. In contrast, with an non-volatile memory it suffices to reprogram the memory to complete this task.

Figure 5:
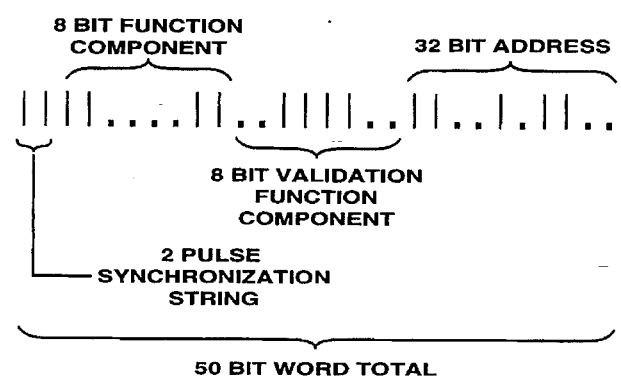
FIG. 5 illustrates the binary coded sequence pattern used by the portable hand-held transmitter to convey command and data signals to the slave controller.

Another form of construction, which is the preferred mode under the present invention, is to utilize a microprocessor based encoder ( a microprocessor unit commercialized by MICROCHIP under part number PIC16C54 has been found satisfactory) with software designed to intelligently assemble the binary coded sequence in dependence of the signals received from the keypad 12. In essence, the microprocessor continuously scans the keypad 12 and records the various keystrokes. On the basis of the identity of the depressed keys the program will produce a string of 8 bits, referred below as function component, that uniquely represents the function to be performed by the vehicle, such as starting the motor, activating the alarm system, etc. The program then generates an 8 bit validation function component that is a coded version of the function component. The purpose of the validation function component is to allow the slave controller on board the vehicle to validate the binary coded sequence as it will be described hereinafter. Finally the program appends to the function component and the validation function component two synchronizing pulses and a 32 bit address component whose purpose is to identify uniquely the vehicle to which the binary coded sequence is directed. FIG. 5 graphically depicts the pattern of the entire binary coded sequence generated by the encoder 14.

Various coding schemes may be adopted for generating the 8 bit validation function component. In a preferred embodiment, a coding method that consists of reversing the logical value of each bit of the function component is used. For example, if the function component has the following bit sequence

11010010 the validation function component will be

00101101

The RF oscillator use the 100% amplitude modulation technique to transmit the binary coded sequence produced by the encoder 14. This approach consists of generating a burst of electromagnetic radiation at a predetermined frequency to communicate the logical value 1. In contrast, a silent oscillator during a predetermined time interval signals a logical 0. This mode of data transmission is well known to those skilled in the art.

Figure 4:
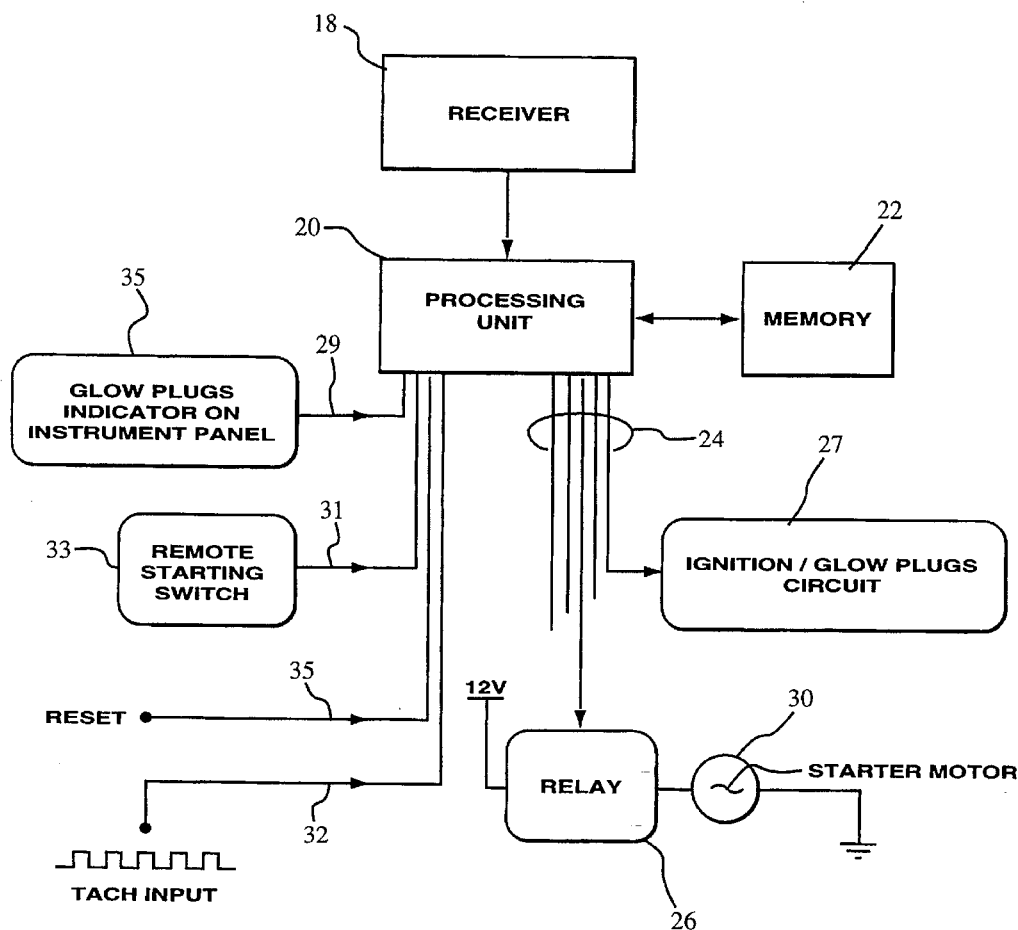
FIG. 4 is a functional diagram of the slave controller mounted on board the vehicle.

With reference to FIG. 4, the slave controller mounted on board the vehicle comprises a receiver circuit 18 of known construction that senses the incoming RF signals from the oscillator 16 and converts the signal into a binary form suitable for processing by a processing unit 20. The processing unit 20 is an industrial controller that is software driven and executes instructions stored into a non-volatile memory 22. The processors MC68HC70568P, MC68MC705C9P or MC68HC705J2P from MOTOROLA have been found satisfactory. Alternatively, the processors PIC16C71, PIC7C42 or PIC 16C54 from MICROCHIP could be used.

The processor unit 20 generates control signals on a bus 24 that leads to the various components of the vehicle that are being controlled. One of the bus lines controls the conduction state of a relay 26 that in turn energizes or de-energizes the starter motor 30 of the engine. Another line of the bus 24 actuates the ignition and for glow plugs circuit of the vehicle through a relay 27. When the relay 27 conducts, it establishes an electrical path bypassing the key-operated ignition switch of the vehicle. The remaining lines of the bus 24 lead to other components of the vehicle that the processing unit 20 controls, such as power doors and windows, the alarm system etc. These functions will not be described because they do not form part of the invention.

The processor unit 20 also includes a series of input lines for gathering data that is necessary for the execution of the program. A glow plugs status input 29 monitors the operational state of a glow plugs indicator 35(only for diesel applications) on the instrument panel of the vehicle in order to sense when the glow plugs operational cycle has been completed. This feature will be discussed in detail later. An input line 31 connected to a manually operated toggle switch 33 enables the processing unit 20 to determined the position of the switch, weather ON or OFF. The toggle switch 33 is mounted on the instrument panel of the vehicle during the installation of remote vehicle starting system. Its purpose is to allow the user to disable the remote starting function of the slave controller. When the toggle switch 33 is placed in the OFF position the slave controller takes no action when a start-up command is issued by the portable hand-held transmitter. To enable the remote start-up function, the toggle switch 33 must be in the ON position.

A reset line 35 provides facility to restore the processor unit 20 to its initial state of operation. When the processor unit 20 observes a pulse on the reset line 35 it immediately aborts the current operation and initiates a new program execution cycle. Preferably, the pulse on the reset line 35 is generated by manually closing a switch (not shown in the drawings) in the electrical path of the reset line 35. This feature is useful to selectively terminate the programming mode of the slave controller during the installation of the system on the vehicle, as it will be described later.

A tachometer input 32 receives a pulse signal whose frequency is proportional to the speed of rotation of the engine. This information is required by the processing unit 20 to determine when the engine has been successfully started so as to de-energize the starter motor 30. The pulse train supplied to the tachometer input 32 is obtained from different sources depending upon the kind of internal combustion engine that is being controlled by the system. For spark-induced combustion engine (typically gasoline engines) the tachometer input 32 is connected at an appropriate location in the electrical ignition system. Usually, this location is the negative terminal of the ignition coil. At every cylinder ignition event the tachometer input 32 observes a pulse. The frequency of these pulses is proportional to the speed of rotation of the crank shaft.

For diesel applications that lack an electrical ignition system, the tachometer input 32 is connected to a speed detecting device that responds to the magnetic field pulsations produced by the alternator of the engine. The speed detecting device is illustrated in FIGS. 1 and 2 and comprise a Hall-effect sensor 34 connected to a band pass filter 36 attenuating undesirable harmonic components. The filtered signal is then supplied to a pair of cascaded operational amplifiers 38 and 40 to increase the magnitude o the signal. Finally, the signal is supplied to a divider circuit 41 that reduces the frequency of the pulse train by a factor of 4. The purpose of reducing the frequency is to produce a signal that imitates a tachometer signal from an ignition circuit of an internal spark-induced combustion engine.

The Hall-effect sensor 34, filter 36, amplifiers 38 and 40 and divider circuit 41 are mounted into a protective housing 42 that is made of moulded rubber-like material. The housing 42 includes a concave wall 44 that conforms to the curvature of the casing 46 of the alternator 48. The casing 42 is clamped against the alternator 48 by a suitable clamp 50. Adhesive mounting is possible but not preferred because it makes disassembly and re-installation more difficult.

When the engine is operating, the rotor of the alternator 48 is turning and produces a rotating magnetic field. For a stationary observer, the rotating field appears as a succession of pulsations. When those pulsations sweep the Hall effect sensor 34, the sensor generates electric pulses that are conditioned by the filter 36, amplifiers 38 and 40 and divider circuit 41 and then received by the tachometer input 32. The frequency of the pulses observed by the tachometer input 32 is proportional to the speed of rotation of the crank shaft since the alternator is driven by a fixed ratio pulleys/belt transmission. Accordingly, by properly calibrating the processing unit 20, the signal generated by the Hall-effect 34 sensor can be used to determine the speed of rotation of the diesel engine.

Figure 6A:
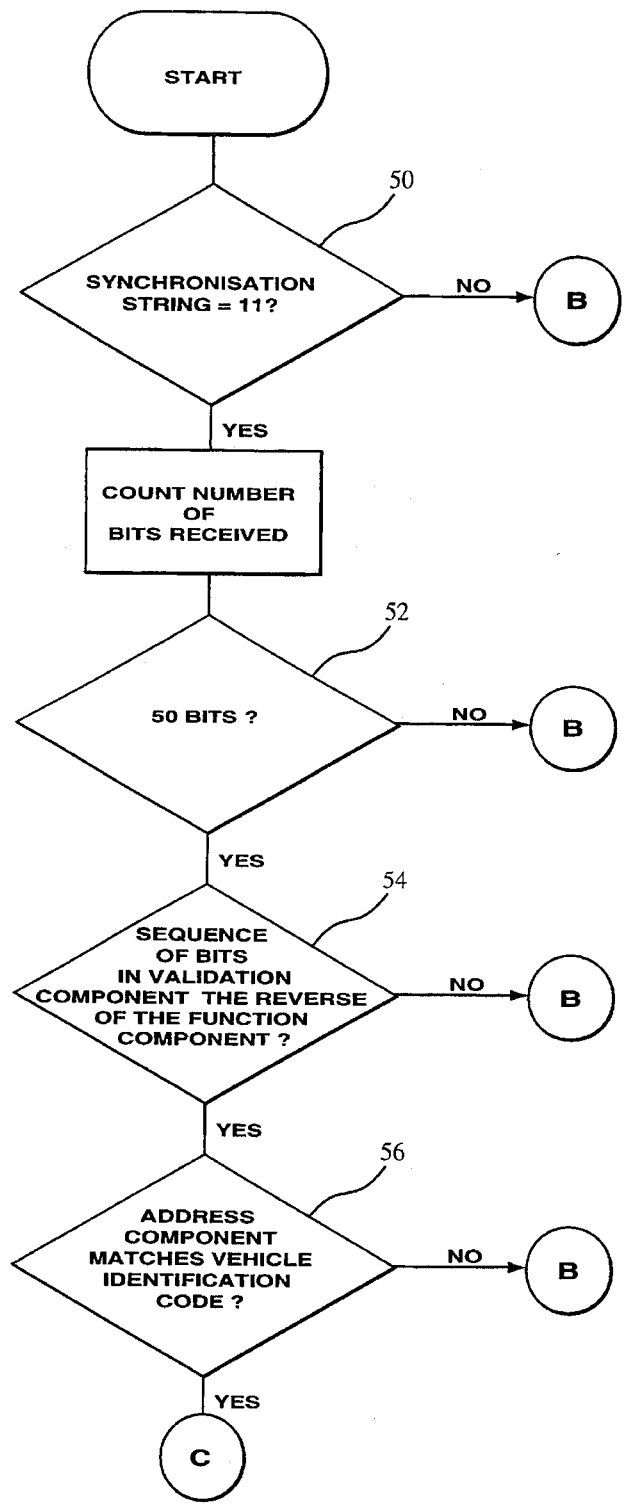
FIGS. 6a to 6c depict a flow chart illustrating the operation of the remote vehicle starting system in accordance with the invention.
Figure 6B:
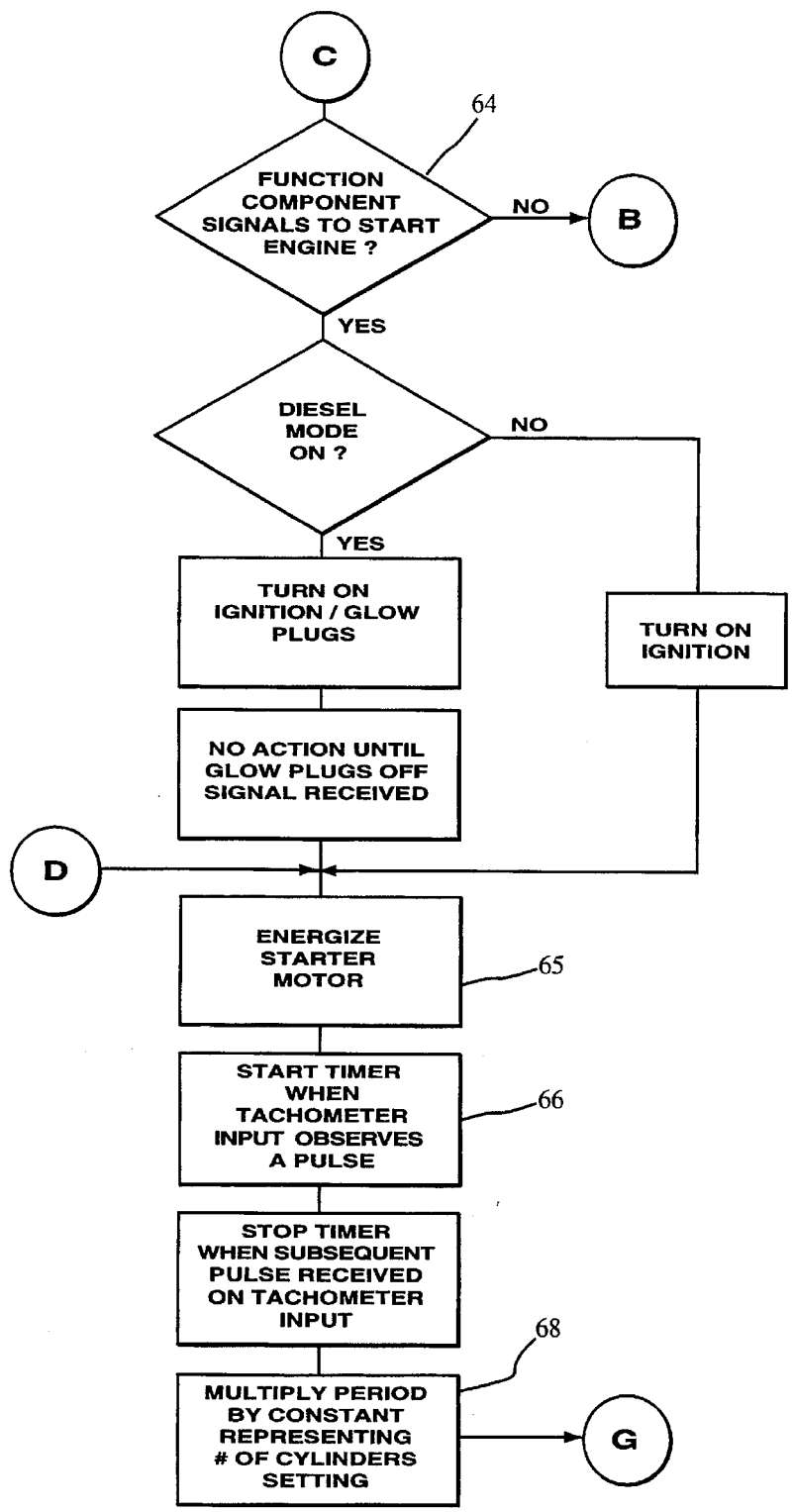
Figure 6C:
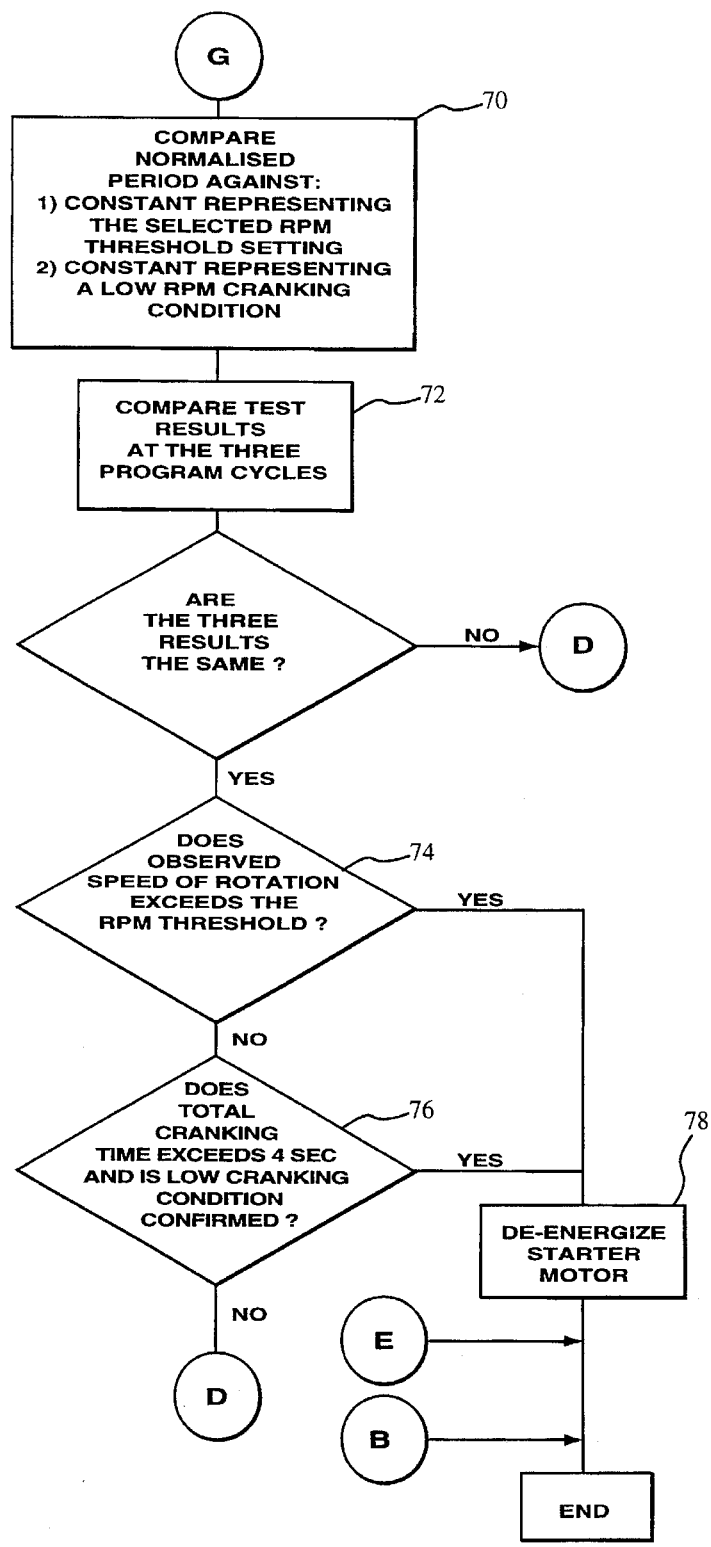

The operation of the remote vehicle starting system in accordance with the invention will now be described with reference to the program flow chart of FIGS. 6a to 6c.

The flow chart assumes two things. First that the slave controller has been properly adjusted in accordance with the parameters of the engine it controls. Such parameters include the number of cylinders of the engine, the speed that the engine must attain before the starter motor 30 is de-energized and whether the engine is of the diesel type. The adjustment procedure will be described in detail later. Second that the user of the system desires to start the engine of the vehicle and at this end, has depressed the appropriate key on the keypad 12. In response to the key actuation the encoder 14 will generate the 50 bit sequence comprising the 2 pulse synchronization string, the 8 bit function component, the 8 bit validation function component and the 32 bit address component that uniquely identifies the vehicle. When this signal is sensed by the receiver 18 and supplied to the processing unit 20, the first step in the execution of the program is a verification at step 50 to determine if the incoming signal has the proper synchronization component, that is the two bit string 11. In the affirmative, the system counts the number of bits that are received. If 50 bits are counted at step 52, then the system proceeds to step 54 where the 8 bit function component is compared to the 8 bit validation function component. More specifically, this is achieved by decoding the 8 bit validation function component by reversing the logical state of each bit of the sequence of bits that form the validation function component. The decoded validation function component is then compared with the function component; if a match is observed, the function component is validated and the program proceeds to step 56 where the address component is compared with a vehicle identification code stored in the memory 22. The purpose of this operation is to ensure that the slave controller accepts commands only from the hand-held transmitter of the legitimate owner.

If any one of the tests at steps 50, 52 54 and 56, fails, the program flow is redirected to bypass the start-up sequence and no action is taken by the slave controller on the vehicle.

Assuming that the tests at steps 50, 52, 54 and 56 have been passed successfully, the program will identify what is the function which must be performed by the vehicle. The slave controller could be designed to recognize several possible function components to effect a variety of operations, such as starting the engine, raising or lowering the windows, locking or unlocking the doors, unlocking the trunk, arming or de-activating the alarm system, among others. When the programm in the processor unit 20 identifies the specific function that the slave controller should perform, the programm execution is directed along a specific processing thread designed to carry into effect the desired operation. The flow chat on FIGS. 6a to 6c depict a single processing thread which is the engine start-up sequence. The logic for other secondary functions that the slave controller may perform will not described because such functions are not part or the present invention.

The next step of the program is a conditional test 64 to determine if the function component signals to initiate the engine start-up sequence. If the function component is confirmed as being an engine start-up command, then the processing unit 20 examines the status of a flag in the memory 22 indicating the engine type, whether diesel or spark-induced combustion type (the flag setting procedure is described later). If the flag is set indicating that the diesel mode is ON then the processor unit 20 actuates the ignition system on the vehicle by energizing the relay 27 to establish an electrical path by-passing the ignition switch. In essence, setting the relay 27 in the conduction mode corresponds to turning the ignition key to the "ON" position. Depending upon the external temperature the electronic control module of the vehicle will then actuate the glow plugs to heat the combustion chambers.

The vast majority of diesel vehicles are equipped with some sort of indicator on the instrument panel, typically a lamp, allowing the driver to monitor the operation of the glow plugs. When the glow plugs are energized the lamp is "ON" which signals the drive to wait before cranking the engine. The lamp turns "OFF" when the combustion chambers heating cycle is completed. At that point he driver can crank the engine. The processor unit 20 reads the state of the glow plugs indicator on the instrument panel through the line 29 in order to determine the duration of the dwell cycle prior to energizing the starter motor 30. If the indicator is "ON" no action is taken by the programm. The relay 26 is closed in order to crank the engine only when the indicator turns "OFF".

It should be appreciated that the processor unit 20 does not control the glow plugs of the vehicle. The processor unit 20 merely triggers the ignition sequence by closing the relay 27. At that point he electronic control module on board the vehicle, without any assistance from the processor unit 20, performs the glow plugs operative cycle. The processor unit 20, however, monitors the glow plugs operation by reading the state of the indicator on the instrument panel. When the indicator signals that the combustion chambers heating cycle is completed, the processor unit 20 seizes control of the starter motor 30.

For a non-diesel application the processor unit 20 merely turns the ignition ON by closing the relay 27 then energizes the starter motor 30 at step 65.

At step 66 the processor unit 20 monitors the tachometer input 32 for pulsations that may be coming either form an electrical ignition system or the speed measuring device at the alternator. When a pulse is observed the processing unit 20 starts counting time. The timer is stopped when a subsequent pulse is received at the tachometer input 32. The elapsed time between two successive pulsed represents the period of the tachometer signal.

At step 68 the measured time period is multiplied by a constant representing the number of cylinders setting. The constant may be any value that enables the processor to normalize the speed reading so that any further computation becomes independent of the number of cylinders of the engine. For example, the constant in the case of a six cylinder engine may be the integer 6.

At step 70, the normalized period is compared against a constant representing the selected RPM threshold setting to determine if the engine speed is above or below the selected speed at which the cranking cycle should be terminated. The normalized period is also compared against a constant representing a low RPM cranking condition. The engine is deemed in the low RPM cranking condition if the normalized period represents a speed below 200 RPM. The above comparison returns two results allowing the processor unit 20 to determine:

a) if the engine has started (when the normalized period is less than the constant representing the selected RPM threshold setting) or not (when the normalized period is larger than the constant representing the selected RPM threshold setting); and b) if the engine is in the low RPM cranking condition (when the normalized period is larger than the constant representing the low RPM cranking condition) or not (when the normalized period is less than the constant representing the low RPM cranking condition).

The results of the dual-test performed during the current program cycle a Well as the results returned at the last two program execution cycles are kept in the memory 22. This data is continuously updated at every execution cycle by discarding the oldest set of results and writing in the memory the most current set of results.

A step 72 the test results returned at the three program cycles are compared. If they are the same, the results for both test are validated. The purpose of the results comparison is to avoid misinterpretations of the tachometer signal. In the environment of a combustion engine electrical noise can locally corrupt the tachometer signal by inducing voltage spikes. Those spikes can be interpreted by the processing unit 20 as genuine pulses representing cylinder ignition events or magnetic field pulsations at the alternator. To avoid such difficulties the processor unit 20 validates the test results at step 72 only if three consecutive program cycles have returned the same data.

If the test result are not the same the program execution is returned at step 65 otherwise the program performs a conditional test (step 74) to determine whether the starter motor should be de-energized or not. If the validated results indicate an engine speed less than the RPM threshold setting the engine cranking continues and a conditional test at step 76 is performed to sense obvious malfunction conditions that would prevent the engine from starting. If the validated results of the test at step 70 indicate a low RPM cranking status the total cranking time (separately measured by a timer started when step 65 is executed for the first time) is accumulated and compared against a limit value of four seconds. If the four seconds value is exceeded the processor unit 20 determines that the starter motor is unable to crank the engine at a sufficient speed so that it can start. Accordingly the starter motor is de-energized at step 78 and no further action is taken. The four seconds delay is used because in some applications the starter motor can build-up speed over time. At the beginning of the cranking cycle the engine speed may be too low for starting, however, after a second or two the cranking speed may increase so that the engine can start.

If the test at step 76 fails the execution of the program is returned to step 65 and the loop is repeated until the test 74 is satisfied in that the observed speed of rotation exceeds the RPM threshold. At that point, the starter motor 30 is de-energized at step 78.

If desired, a conditional test may be incorporated in the loop between steps 65 and 76 to avoid continual engine cranking in a case where the engine speed exceeds 200 RPM yet the engine is malfunctioning and unable to start. Such conditional step may be implemented by measuring the total amount of engine cranking time. If the time exceeds a predetermined limit, say 10 seconds, the program exits the loop, de-energize the starter motor 30 and no further action is taken.

Figure 7A:
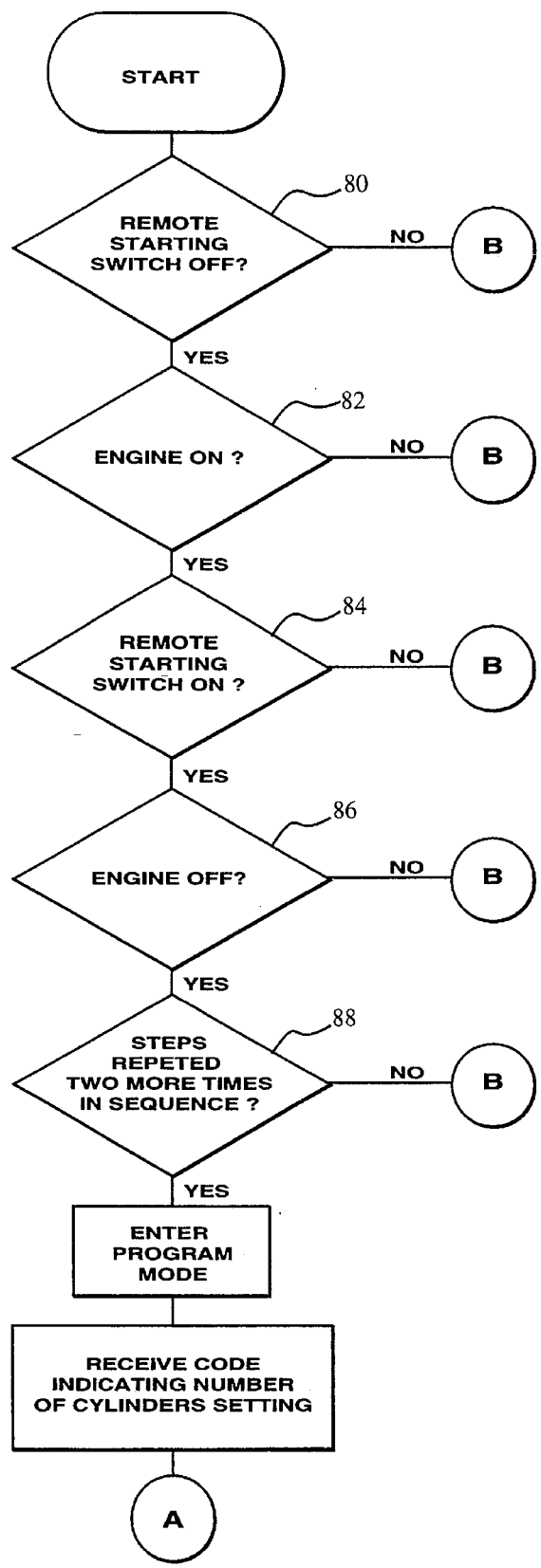
FIGS. 7a and 7b depict a flow chart illustrating the sequence of steps for remotely changing settings of the slave controller.
Figure 7B:
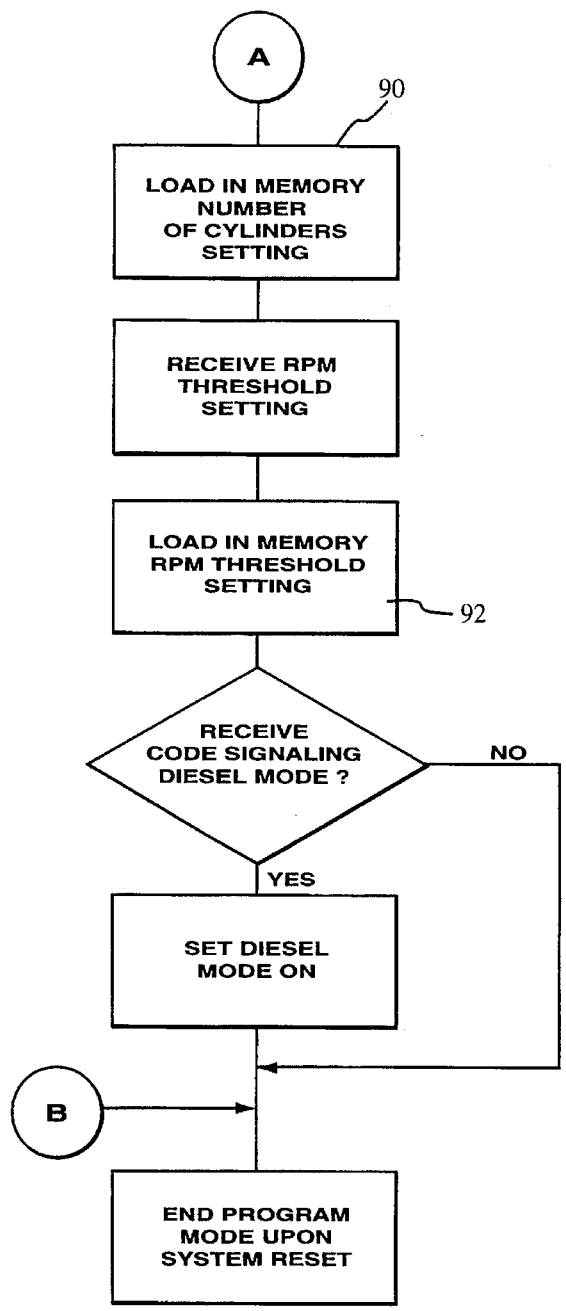

The flow chart on FIGS. 7a and 7b illustrates the procedure for changing the setting of the slave controller, namely the number of cylinders of the engine, the speed of rotation of the engine (RPM threshold value) a which the cranking cycle should be terminated, and the type of engine, diesel of spark-induced combustion. Such limited programing is performed during the installation of the system in order to adapt the slave controller to the parameters of the specific vehicle.

The number of cylinders is an important factor to enable a correct interpretation of the tachometer signal observed at the negative terminal of the coil (for spark-induced combustion engines). The frequency of tachometer signal depends upon the speed of rotation of the engine and the number of cylinders. To enable the installer to lock in memory the number of cylinders setting the slave controller is first placed In the programing mode. This is achieved by performing a predetermined three-phase sequence of operation of certain components of the vehicle. Each phase includes the following steps. First, the toggle switch 33 on the instrument panel of the vehicle is set to the OFF position. The processing unit 20 determines the status of the switch 33 via the input line 31. Second, the engine is manually stated. The processor unit 20 determines that the engine has started when it observes pulses at the tachometer input 32. Third, the toggle switch 33 i s placed in the ON position. Fourth, the engine is manually turned off. This four-step phase of the sequence is reflected by steps 80, 82, 84 and 86 of the flow chart in FIGS. 7a and 7b. Step 88 is a consolidated conditional test that requires two additional executions of steps 80 to 86 to unlock the programming mode. In short, the four-step phase must be repeated two more times to enable the installer to change the system settings.

If step 88 has been successfully completed, the slave controller enters the programming mode. At that point, the execution of the programm is interrupted until a binary coded sequence is received from the hand-held transmitter whose function component is a code corresponding to the desired number of cylinders setting. In a most preferred embodiment the system recognizes seven different settings (1,2,4,6,8,10 and 12 cylinders), Assuming that the keypad 12 on the hand-held transmitter has a total of four keys, the code that specifies a two cylinder engine may be obtained by simultaneously depressing keys 1 and 2, while a code for a six cylinder engine by depressing keys 1 and 3, etc.

When the code is received, it is loaded in the memory 22 at step 90. The execution of the program is interrupted again to await the next binary transmission sequence whose function component convey a code specifying the speed that the engine must reach in order to deactivate the starter motor. In a most preferred embodiment, the speed can be et at either 600 and 800 RPM. When the speed setting code i received, it is loaded in memory at step 92. Each different number of cylinders setting can be regarded as a specific mode for processing the tachometer signal. The difference between the various processing modes established by the number of cylinders settings range resides in the value of the number that multiplies the period of the tachometer signal in order to normalize it.

Next, the program flow is interrupted for the third time to await the third binary coded sequence under the programming mode that specifies the type of engine that is being control led, namely diesel or spark-induced combustion type. If a the code specifies a diesel application a flag is set in the processor unit 20 in order to run the special routine that monitors the operation of the glow plugs during the start-up procedure, as described earlier. For spark-induced combustion applications no flag is set.

To exit the programming mode a reset signal is placed on the line 35 to restore the processor unit 20 to the initial condition an initiate a new program execution cycle with the new settings. The reset condition can be established by closing a manually operated switch (not shown in the drawings) placed in the electrical path of the line 35.

Referring back to FIGS. 6a to 6c it will be apparent that the execution of the start-up routine (steps 65 to 78) is essentially the same for diesel and spark-induced combustion applications except that in diesel installations the tachometer input 32, instead of receiving pulsations from he negative terminal of the coil observes the pulses generated by the Hall-effect sensor 34. The processing unit 20 "thinks" that the pulse signal reflects the electrical activity the ignition system of a spark-induced combustion engine while in reality those pulses represent the magnetic field pulsations produced by the alternator. Compatibility between the slave controller and the speed detecting device is established by conditioning the pulse train generated by the Hall-effect sensor 34 to imitate as much as possible a tachometer signal produced by an electric ignition system. This is achieved by dividing the frequency of the pules train by a factor of 4 in order to bring it within the range of tachometer signal frequencies that the slave controller can accept. The compatibility is enhanced by placing the processing unit 20 in a setting corresponding to a spark-induced ignition engine which, at a certain speed, manifests an electrical activity at the ignition coil that correspond to the signal produced by the speed detecting device at the same engine speed.

This adjustment procedure is performed by trial and error. Usually, the technician will set the RPM threshold at the lower level (600 RPM) and the number of cylinders setting to a mid point value, say 4 cylinders. He then attempts to start the engine and corrects the setting if a problem in the operation of the system is observed. Incremental changes in the RPM threshold sorting provide a fine adjustment. For broad adjustment steps, the technician shifts to another number of cylinders setting and he switches through the various number of RPM threshold settings until the best mode of operation is reached.

It will be apparent that the selected number of cylinder settings is not related to the number of cylinders of the diesel engine. Similarly, the RPM threshold setting is unrelated to the actual speed at which the starter of the diesel engine is designed to disengage.

It is pointed out that the details of the construction of blocks representing the various circuits of the hand-held transmitter, the slave controller and the Hall-effect sensor speed detecting device are not discussed herein because they are standard state of the art circuit that are well known to those skilled in the art. In addition, the individual program steps and procedures in the operational flow charts can be implemented by a variety of conventional programming well known to the notional addressee.

The above description of the invention should not be interpreted in any limiting manner since modifications and refinements can be made without departing from the spirit of the invention. The scope of the invention is defined in the appended claims.

We claim:

1. A device for detecting the rotational speed of a rotary internal combustion engine driving an alternator having a rotor, comprising a Hall-effect sensor responsive to a pulsating magnetic field produced by the rotor for generating a signal having a period and being indicative of the rotational speed, and a dividing circuit coupled to said Hall-effect sensor for increasing said period.

2. A device as defined in claim 1, comprising an amplifier coupled to said Hall-effect sensor for increasing a magnitude of said signal.

3. A device as defined in claim 2, comprising a filter coupled to said Hall-effect sensor for conditioning said signal in a predetermined manner.

4. A device as defined in claim 3, wherein said filter is a pass-band filter.

5. A device as defined in claim 1, comprising a protective casing enclosing said Hall-effect sensor.

6. A device as defined in claim 5, wherein said protective casing includes a concave wall conforming to an outer surface of the casing of the alternator.

7. A device for use with a diesel engine driving an alternator, said device simulating a tachometer signal reflecting an electrical activity of an ignition system of a spark-induced combustion engine, said device including:

a Hall-effect sensor for mounting to the alternator outside a casing thereof, said Hall-effect sensor being responsive to a pulsating magnetic field produced by a rotor of the alternator for generating a pulse train signal indicative of the rotational speed of the rotor; and processing means coupled to said Hall-effect sensor for reducing a rate of occurrence of pulses generated by said Hall-effect sensor, whereby individual pulses produced by said processing means simulate cylinder ignition events of the spark-induced combustion engine.

8. A device as defined in claim 7, wherein said processing means includes a dividing circuit for increasing a period of said pulse train signal.

9. A device as defined in claim 8, wherein said dividing circuit increases a period of said pulse train by a factor of about 4.

10. A system for remotely starting rotary engine of a vehicle having a starting motor and an alternator for generating a pulsating magnetic field, which comprises (i) a portable hand-held transmitter for generating a predetermined RF command signal, (ii) a controller for mounting in the vehicle, having
   (a) a processing unit,
   (b) a receiver for sensing said predetermined RF command signal, in response to the detection of said signal said processing unit actuating the starter motor to crank the engine, and
   (c) a Hall-effect sensor for detecting the rotary speed of the engine to deactivate the starter motor when the engine has reached a predetermined speed of rotation, said Hall-effect sensor generating a succession of pulses in response to the pulsating magnetic field of said alternator, said processing unit having means for measuring the lapse of time between successive pulses for deriving data indicative of the speed of rotation of the engine.

11. A system for remotely starting a diesel rather than a spark-ignited internal combustion engine of a vehicle, having an alternator with a rotor, and a starting motor, said system comprising:

a portable hand-held transmitter for generating a predetermined RF command signal;

a slave controller for mounting in the vehicle, and including:
   (a) a receiver for sensing said predetermined RF command signal;
   (b) a processing unit coupled to said receiver, in response to detection of said predetermined RF command signal, said processing unit actuating the starter motor to crank the engine, and including an input for receiving an engine speed indicating signal, said processing unit being capable of selectively assuming either one of a plurality of engine speed indicating signal processing modes associated with respective internal spark-ignited combustion engines having different number of cylinders;
   (c) a device for detecting a rotational speed of the diesel engine, said device being responsive to a pulsating magnetic field produced by the rotor for generating a periodic signal in lieu of the rotational speed of a signal from the ignition circuit of a spark-ignited combustion engine, said device being connected to said input, whereby said periodic signal is accepted by said processing unit as if it were an ignition circuit-derived tachometer signal from a spark-ignited combustion engine, said processing unit in a selected one of said processing modes acting on said periodic signal to derive data correlated to a speed of rotation of the diesel engine, said processing unit being responsive to said data to deactivate the starter motor when the speed of the diesel engine exceeds a preset limit.

12. A system as defined in claim 11, wherein said device for detecting a rotational speed of the diesel engine includes a Hall-effect sensor.

13. A system as defined in claim 12 comprising an electric circuit in an electrical path between said Hall-effect sensor and said processing unit for reducing a rate of occurrence of pulses generated by said Hall-effect sensor in response to magnetic field pulsations produced by the rotor of the alternator of the diesel engine.

14. A system for remotely starting rotary engine of a vehicle having a starting motor and an alternator for generating a pulsating magnetic field, which comprises (i) a portable hand-held transmitter for generating a predetermined RF command signal, (ii) a controller for mounting in the vehicle, having
  (a) a processing unit,
  (b) a receiver for sensing said predetermined RF command signal, in response to the detection of said signal said processing unit actuating the starter motor to crank the engine, and
  (c) a Hall-effect sensor for detecting the rotary speed of the engine to deactivate the starter motor when the engine has reached a predetermined speed of rotation, said Hall-effect sensor generating a succession of pulses in response to the pulsating magnetic field of said alternator, said processing unit having means for deriving data indicative of the speed of rotation of the engine from the succession of pulses.

15. A system as defined in claim 14, further comprising an electric circuit in an electrical path between said Hall-effect sensor and said processing unit for reducing a rate of occurrence of pulses generated by said Hall-effect sensor.

16. The system of claim 14, wherein said means for deriving data comprises means for measuring the lapse of time between successive pulses.

* * * * *